US012740382B2

(12) United States Patent
Yu et al.

(10) Patent No.: US 12,740,382 B2
(45) Date of Patent: Sep. 15, 2026

(54) TEST KEY STRUCTURE

(71) Applicant: United Semiconductor (Xiamen) Co., Ltd., Xiamen (CN)

(72) Inventors: Jin Hui Yu, Shamen City (CN); Rong He, Shamen City (CN); Hailong Gu, Singapore (SG); You-Di Jhang, New Taipei City (TW); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 812 days.

(21) Appl. No.: 18/123,357

(22) Filed: Mar. 20, 2023

(65) Prior Publication Data

US 2024/0290667 A1 Aug. 29, 2024

(30) Foreign Application Priority Data

Feb. 24, 2023 (CN) ........................ 202310161088.4

(51) Int. Cl.
*H10P 74/00* (2026.01)

(52) U.S. Cl.
CPC .......... *H10P 74/273* (2026.01); *H10P 74/277* (2026.01)

(58) Field of Classification Search
CPC .. H10P 74/273; H10P 74/277; G01R 31/2884
See application file for complete search history.

(56) References Cited

U.S. PATENT DOCUMENTS 8,486,587 B2 7/2013 Tsai
9,275,933 B2 3/2016 Kuo
9,748,139 B1 8/2017 Liou
9,761,791 B2 9/2017 Shiu
10,090,465 B2 10/2018 Hsu
2016/0064295 A1* 3/2016 Chao ..................... H10P 74/277 257/48
2023/0290694 A1* 9/2023 Yang ........................ H10D 1/47

* cited by examiner

*Primary Examiner* — Alexander G Ghyka
(74) *Attorney, Agent, or Firm* — Winston Hsu

(57) ABSTRACT

A test key structure includes a substrate; a first metal pad disposed on the substrate; a second metal pad disposed in proximity to the first metal pad on the substrate; a gap between the first metal pad and the second metal pad; a first contact disposed on the first metal pad; and a second contact disposed on the second metal pad.

7 Claims, 2 Drawing Sheets

TEST KEY STRUCTURE

BACKGROUND OF THE INVENTION

1. Field of the Invention

The invention relates to the field of semiconductor technology, in particular to a test key structure.

2. Description of the Prior Art

In the semiconductor fabrication, a semiconductor device or an integrated circuit is continuously tested in every step so as to maintain the device or circuit quality. Normally, a testing circuit is simultaneously fabricated with an actual device so that the quality of the actual device is judged by the performance of the testing circuit. The quality of the actual device is therefore well controlled. A wafer acceptance test (WAT) is frequently employed to detect defects on a wafer. The WAT method includes testing several test keys distributed on scribe lines between dies.

However, there is still no effective test key structure that can provide online monitoring for solving the problem of metal residues in small gaps with a width of less than 0.15 μm between large-area metal regions.

SUMMARY OF THE INVENTION

One object of the present invention is to provide a test key structure in order to solve the deficiencies or shortcomings of the prior art.

One aspect of the invention provides a test key structure including a substrate; a first metal pad disposed on the substrate; a second metal pad disposed in proximity to the first metal pad on the substrate; a gap between the first metal pad and the second metal pad; a first contact disposed on the first metal pad; and a second contact disposed on the second metal pad.

According to some embodiment, the first contact is electrically connected to a first voltage and the second contact is electrically connected to a second voltage that is different from the first voltage.

According to some embodiment, the first metal pad comprises aluminum, titanium nitride or tantalum nitride.

According to some embodiment, the second metal pad comprises aluminum, titanium nitride or tantalum nitride.

According to some embodiment, the first metal pad and the second metal pad have a dimension of equal to or greater than 1 μm×1 μm.

According to some embodiment, the gap has width of equal to or less than 0.2 μm.

Another aspect of the invention provides a test key structure including a substrate; an array of metal pads disposed on the substrate; a gap between the array of metal pads; and an array of contacts disposed on the array of metal pads, respectively.

According to some embodiment, the array of contacts comprises first contacts electrically connected to a first voltage and second contacts electrically connected to a second voltage that is different from the first voltage.

According to some embodiment, the first contacts and the second contacts are arranged in a staggered manner.

According to some embodiment, the first contacts are electrically connected to a first interconnect line and the second contacts are electrically connected to a second interconnect line, wherein the first interconnect line and the second interconnect line are in different metal levels.

According to some embodiment, each of the array of metal pads comprises aluminum, titanium nitride or tantalum nitride.

According to some embodiment, each of the array of metal pads has a dimension of equal to or greater than 1 μm×1 μm.

According to some embodiment, the gap has width of equal to or less than 0.2 μm.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
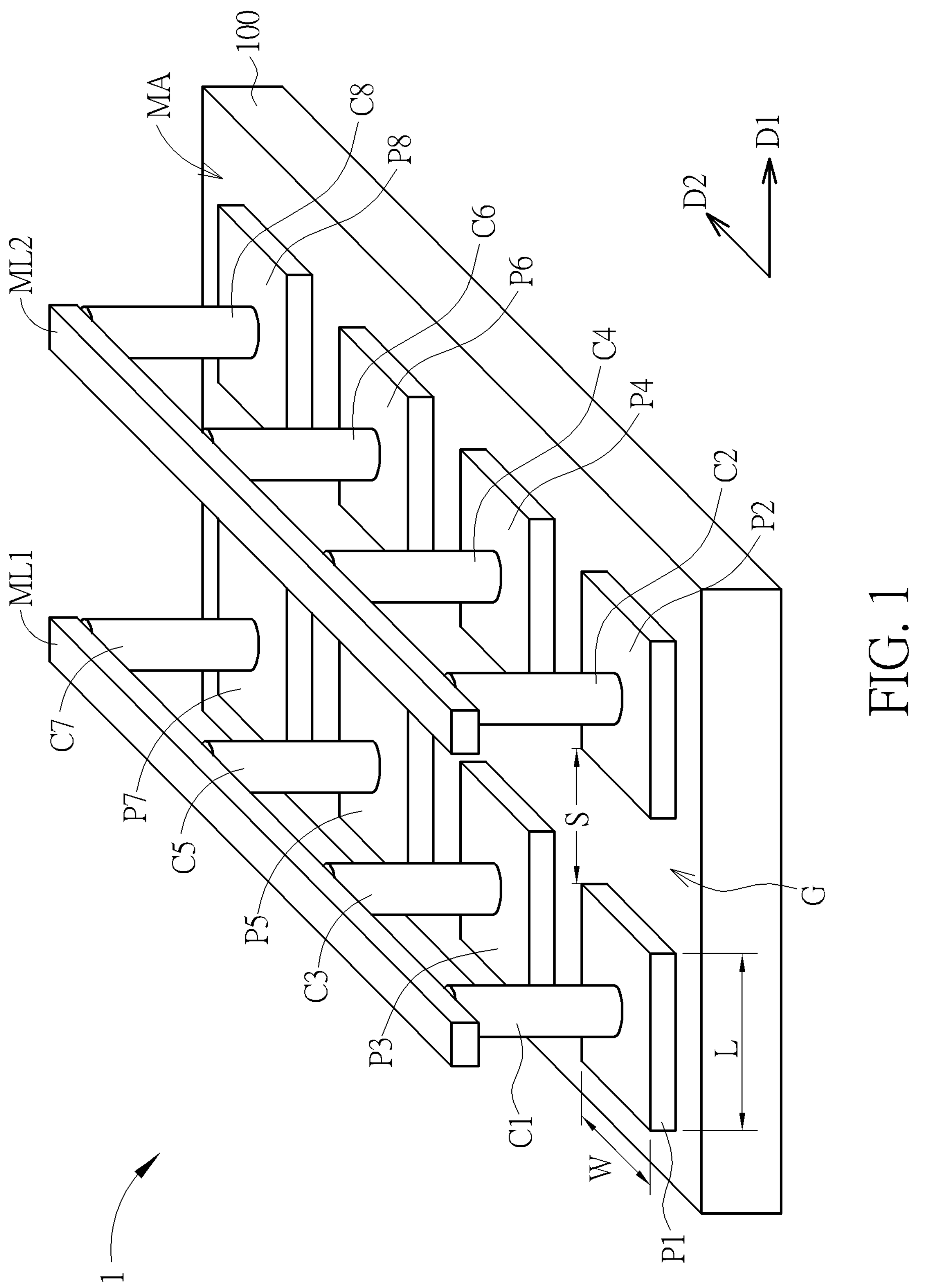
FIG. 1 is a three-dimensional side view of a test key structure according to an embodiment of the present invention

Please refer to FIG. 1, which is a three-dimensional side view of a test key structure according to an embodiment of the present invention. As shown in FIG. 1, the test key structure 1 includes a substrate 100 and a metal pad array MA disposed on the substrate 100. According to an embodiment of the present invention, for example, the substrate 100 may be a silicon substrate, but is not limited thereto. According to an embodiment of the present invention, for example, the metal pad array MA may be a 2×1 array, a 2×2 array, a 2×3 array, a 3×3 array, or a 2×4 array or the like. FIG. 1 illustrates with a 2×4 array. The metal pad array MA includes a metal pad P1 and a metal pad P2 in proximity to the metal pad P1, which are aligned and arranged on the substrate 100 along the first direction D1. A gap G is provided between the metal pad P1 and the metal pad P2. Metal pads P3-P7 aligned with the metal pad P1 and metal pads P4-P8 aligned with the metal pad P2 are further arranged along the second direction D2, forming a 2×4 metal pad array.

According to an embodiment of the present invention, the metal pads P1-P8 may include aluminum, titanium nitride or tantalum nitride, but are not limited thereto. According to an embodiment of the present invention, the size of each of the metal pads P1-P8 is equal to or greater than 1 μm×1 μm. According to an embodiment of the present invention, for example, the length L of each of the metal pads P1-P8 is equal to or greater than 1 μm, and the width W is equal to or greater than 1 μm. According to an embodiment of the present invention, the width S of the gap G is equal to or smaller than 0.2 μm. According to another embodiment of the present invention, the width S of the gap G is equal to or smaller than 0.15 μm.

According to an embodiment of the present invention, the test key structure 1 further includes contacts C1-C8 respectively disposed on the metal pads P1-P8. According to an embodiment of the present invention, the contacts C1-C8 form a 2×4 contact array, and are correspondingly disposed on the 2×4 metal pad array. According to an embodiment of the present invention, the contacts C1, C3, C5 and C7 are electrically connected to the interconnection line ML1, and the contacts C2, C4, C6 and C8 are electrically connected to the interconnection line ML2. According to an embodiment of the present invention, the interconnection line ML1 and the interconnection line ML2 extend along the second direction D2. According to an embodiment of the present invention, for example, the interconnection lines ML1 and ML2 may be copper wires, but are not limited thereto. According to an embodiment of the present invention, the interconnection line ML1 is electrically connected to a first voltage V1, and the interconnection line ML2 is electrically connected to a second voltage V2 different from the first voltage V1. If metal residues in the gaps occur during the manufacturing process, it can be monitored that the resistance value of the test key structure 1 drops significantly, and corresponding measures are taken to improve the yield rate.

Figure 2:
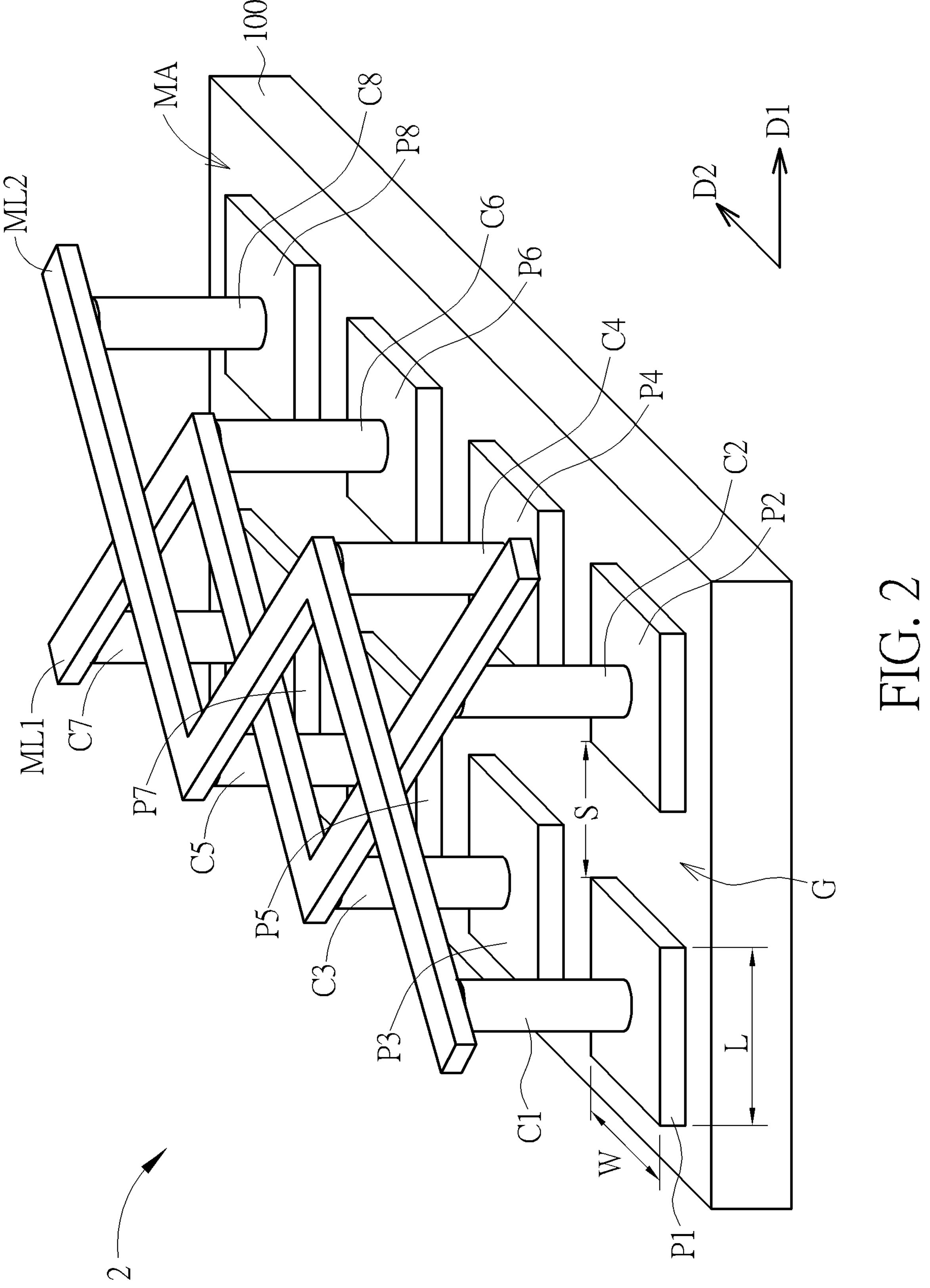
FIG. 2 is a three-dimensional side view of a test key structure according to another embodiment of the present invention.

Please refer to FIG. 2, which is a three-dimensional side view of a test key structure according to another embodiment of the present invention. As shown in FIG. 2, the test key structure 2 includes a substrate 100 and a metal pad array MA disposed on the substrate 100. According to an embodiment of the present invention, for example, the substrate 100 may be a silicon substrate, but is not limited thereto. According to an embodiment of the present invention, for example, the metal pad array MA may be a 2×1 array, a 2×2 array, a 2×3 array, a 3×3 array, or a 2×4 array or the like. FIG. 2 is also illustrated with a 2×4 array. The metal pad array MA includes a metal pad P1 and a metal pad P2 in proximity to to the metal pad P1, which are aligned and arranged on the substrate 100 along the first direction D1. A gap G is provided between the metal pad P1 and the metal pad P2. Metal pads P3-P7 aligned with the metal pad P1 and metal pads P4-P8 aligned with the metal pad P2 are further arranged along the second direction D2, forming a 2×4 metal pad array.

According to an embodiment of the present invention, the metal pads P1-P8 may include aluminum, titanium nitride or tantalum nitride, but are not limited thereto. According to an embodiment of the present invention, the size of each of the metal pads P1-P8 is equal to or greater than 1 μm×1 μm. According to an embodiment of the present invention, for example, the length L of each of the metal pads P1-P8 is equal to or greater than 1 μm, and the width W is equal to or greater than 1 μm. According to an embodiment of the present invention, the width S of the gap G is equal to or smaller than 0.2 μm. According to another embodiment of the present invention, the width S of the gap G is equal to or smaller than 0.15 μm.

According to the embodiment of the present invention, the test key structure 2 further includes contacts C1-C8, respectively disposed on the metal pads P1-P8. According to the embodiment of the present invention, the contacts C1-C8 also form a 2×4 contact array, and are correspondingly arranged on the 2×4 metal pad array. According to an embodiment of the present invention, the contacts C2, C3, C6 and C7 are electrically connected to the interconnection line ML1, and the contacts C1, C4, C5 and C8 are electrically connected to the interconnection line ML2. The contacts C1-C8 are alternately electrically connected to the interconnection lines ML1 and the interconnection lines ML2, respectively. According to an embodiment of the present invention, for example, the interconnection lines ML1 and ML2 may be copper wires, but are not limited thereto. According to an embodiment of the present invention, the interconnection ML1 and the interconnection ML2 are not on the same level, for example, the interconnection ML1 may be located on the first metal layer, and the interconnection ML2 may be located on the second metal layer. If metal residues in the gaps occur during the manufacturing process, it can be monitored that the resistance value of the test key structure 2 drops significantly, and corresponding measures are taken to improve the yield rate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key structure configured to detect a short circuit caused by metal residues, comprising:

a substrate;

a first metal pad disposed on the substrate;

a second metal pad disposed in proximity to the first metal pad on the substrate, wherein the first metal pad and the second metal pad have a dimension of equal to or greater than 1 μm×1 μm;

a gap between the first metal pad and the second metal pad, wherein the gap has width of equal to or less than 0.15 μm;

a first contact disposed on the first metal pad, wherein the first contact is electrically connected to a first voltage; and a second contact disposed on the second metal pad, wherein the second contact is electrically connected to a second voltage that is different from the first voltage to detect the short circuit across the gap.

2. The test key structure according to claim 1, wherein the first metal pad comprises aluminum, titanium nitride or tantalum nitride.

3. The test key structure according to claim 1, wherein the second metal pad comprises aluminum, titanium nitride or tantalum nitride.

4. A test key structure configured to detect a short circuit caused by metal residues, comprising:

a substrate;

an array of metal pads disposed on the substrate, wherein each of the array of metal pads has a dimension of equal to or greater than 1 μm×1 μm;

a gap between the array of metal pads, wherein the gap has width of equal to or less than 0.15 μm; and an array of contacts disposed on the array of metal pads, respectively, wherein the array of contacts comprises first contacts electrically connected to a first voltage and second contacts electrically connected to a second voltage that is different from the first voltage to detect the short circuit across the gap.

5. The test key structure according to claim 4, wherein the first contacts and the second contacts are arranged in a staggered manner.

6. The test key structure according to claim 5, wherein the first contacts are electrically connected to a first interconnect line and the second contacts are electrically connected to a second interconnect line, wherein the first interconnect line and the second interconnect line are in different metal levels.

7. The test key structure according to claim 4, wherein each of the array of metal pads comprises aluminum, titanium nitride or tantalum nitride.

* * * * *